United States Patent
Shin et al.

(10) Patent No.: US 7,884,575 B2
(45) Date of Patent: Feb. 8, 2011

(54) WIRELESS OPTICAL POINTING APPARATUS USING BATTERY AND METHOD OF DETECTING TIME FOR CHANGE/RECHARGE OF BATTERY THEREOF

(75) Inventors: Young-Ho Shin, Yongin-si (KR); Bang-Won Lee, Yongin-si (KR)

(73) Assignee: ATLAB Inc. (KR)

( * ) Notice: Subject to any disclaimer, the term of this patent is extended or adjusted under 35 U.S.C. 154(b) by 834 days.

(21) Appl. No.: 11/755,525

(22) Filed: May 30, 2007

(65) Prior Publication Data
US 2008/0018306 A1 Jan. 24, 2008

(30) Foreign Application Priority Data
Jul. 24, 2006 (KR) .................. 10-2006-0069334

(51) Int. Cl.
*H02J 7/00* (2006.01)
(52) U.S. Cl. .............. 320/132; 320/114; 320/127; 713/324
(58) Field of Classification Search ............... 320/132
See application file for complete search history.

(56) References Cited

U.S. PATENT DOCUMENTS

| | | | |
|---|---|---|---|
| 7,024,321 B1 * | 4/2006 | Deninger et al. | 702/63 |
| 7,265,518 B2 * | 9/2007 | Lee et al. | 320/134 |
| 2004/0049705 A1 * | 3/2004 | Liebenow | 713/320 |
| 2004/0196006 A1 * | 10/2004 | Kawaguchi et al. | 320/132 |
| 2005/0260986 A1 * | 11/2005 | Sun et al. | 455/433 |

FOREIGN PATENT DOCUMENTS

JP 04186115 7/1992

OTHER PUBLICATIONS

Wu, Yan-Xin, "Manufacture of Nickel-cadmium Batter Tester," Experimental Technology and Management, vol. 16, No. 2, 52-53, 1999. English translation having 7 pages. article having 3 pages.

* cited by examiner

*Primary Examiner*—Edward Tso
*Assistant Examiner*—Arun Williams
(74) *Attorney, Agent, or Firm*—Cantor Colburn LLP

(57) ABSTRACT

Provided are an apparatus using a battery and a method of detecting a time to change/recharge the battery in the apparatus. The apparatus includes: a battery for applying a battery voltage; a function unit for receiving the battery voltage to perform an intrinsic operation and cutting off the battery voltage; a voltage divider for dividing the battery voltage to generate a divided voltage; an analog-to-digital converter (ADC) for receiving the battery voltage to convert the divided voltage into a digital voltage signal in response to a measurement control signal before and after a low-power mode is finished; and a controller for receiving the battery voltage to generate a low-power signal for entering the low-power mode, enabling the measurement control signal in response to the low-power signal before and after the low-power mode is finished, and informing a user of a time to change/recharge the battery by detecting the remaining power of the battery using the digital voltage signals generated before and after the low-power mode is finished.

8 Claims, 8 Drawing Sheets

WIRELESS OPTICAL POINTING APPARATUS USING BATTERY AND METHOD OF DETECTING TIME FOR CHANGE/RECHARGE OF BATTERY THEREOF

This application claims the benefit of Korean Patent Application No. 2006-69334, filed Jul. 24, 2006, the contents of which are hereby incorporated herein by reference in their entirety.

BACKGROUND OF THE INVENTION

1. Field of the Invention

The present invention relates to a portable apparatus and, more particularly, to an apparatus using a battery and a method of detecting a time to change/recharge the battery of the apparatus.

2. Description of Related Art

Conventional portable apparatuses employ a battery as a power source and include a circuit for detecting a battery voltage in order to inform a user of the time to change or recharge the battery.

FIG. 1 is a block diagram of a conventional apparatus using a battery.

Referring to FIG. 1, the apparatus includes a battery 10, a function unit 12, a reference voltage generator 14, a voltage divider 16, a comparator 18, and a controller 20. The voltage divider 16 includes resistors R1 and R2. In FIG. 1, the reference voltage generator 14, the voltage divider 16, and the comparator 18 constitute a battery voltage sensor.

Functions of the respective blocks shown in FIG. 1 will now be described.

The battery 10 supplies a battery voltage VBB. The function unit 12 receives the battery voltage VBB and performs its own operation under the control of the controller 20. The reference voltage generator 14 receives the battery voltage VBB and generates a reference voltage Vref. The voltage divider 16 generates a voltage (Vsen=(R2×VBB)/(R1+R2)) divided by the resistors R1 and R2. The comparator 18 receives the battery voltage VBB, compares the divided voltage Vsen with the reference voltage Vref, and generates a comparison output signal Vcom. For example, when the divided voltage Vsen is higher than the reference voltage Vref, the comparator 18 generates a high-level comparison output signal Vcom, and when the divided voltage Vsen is lower than the reference voltage Vref, the comparator 18 generates a low-level comparison output signal Vcom. The controller 20 detects the level of the comparison output signal Vcom and generates a sound for warning a user to change the battery 10 or displays a sign to change the battery 10 on a display unit (not shown). For example, when the low-level comparison output signal Vcom is generated, the controller 20 enables the user to recognize a need to change the battery 10.

That is, in the above-described apparatus using the battery, the battery voltage sensor senses the battery voltage VBB and informs the user of the time for the change of the battery 10. However, when the battery 10 is replaced by a battery having a low intrinsic voltage, even if high power remains in the replaced battery, the battery voltage sensor senses that a voltage of the battery is lower than the reference voltage Vref, and warns the user to change the battery.

For example, some batteries have an intrinsic voltage of 1.5V, while other batteries have an intrinsic voltage of 1.2V. Assuming that the battery voltage sensor is designed based on a battery having an intrinsic voltage of 1.5V such that the reference voltage Vref is 1.2V, when a battery runs down and is replaced by a new battery having an intrinsic voltage of 1.2V, even if high power remains in the new battery, the battery voltage sensor senses that the voltage of the new battery is lower than the reference voltage Vref and warns the user to change the battery.

Therefore, since a battery voltage sensor of a conventional apparatus using a battery senses a battery voltage and informs a user of the time to change a battery irrespective of the intrinsic voltage of the battery, the time to change the battery cannot be accurately detected.

SUMMARY OF THE INVENTION

An embodiment of the invention provides an apparatus using a battery, which detects the remaining power of the battery and informs a user of an exact time to change/recharge the battery even if the intrinsic voltage of the battery varies.

Another embodiment of the invention provides a method of detecting the time to change/recharge a battery of an apparatus using the battery.

Still another embodiment of the invention provides a wireless optical pointing apparatus, which detects the remaining power of a battery and informs a user of an exact time to change/recharge the battery even if the intrinsic voltage of the battery varies.

In one aspect, the present invention is directed to an apparatus using a battery. The apparatus includes: a battery for applying a battery voltage; a function unit for receiving the battery voltage to perform an intrinsic operation; a voltage divider for dividing the battery voltage to generate a divided voltage; an analog-to-digital converter (ADC) for receiving the battery voltage to convert the divided voltage into a digital voltage signal; and a controller for receiving the battery voltage to inform a user of information on the remaining power of the battery using digital voltage signals generated in at least two different points of time.

The voltage divider may include two resistors that are connected in series between the battery voltage and a ground voltage.

In another aspect, the present invention is directed to an apparatus using a battery. The apparatus includes: a battery for applying a battery voltage; a function unit for receiving the battery voltage to perform an intrinsic operation and cutting off the battery voltage; a voltage divider for dividing the battery voltage to generate a divided voltage; an ADC for receiving the battery voltage to convert the divided voltage into a digital voltage signal in response to a measurement control signal before and after a low-power mode is finished; and a controller for receiving the battery voltage to generate a low-power signal for entering the low-power mode, enabling the measurement control signal in response to the low-power signal before and after the low-power mode is finished, and informing a user of a time to change/recharge the battery using the digital voltage signals generated before and after the low-power mode is finished.

The voltage divider may include two resistors and a switch that are connected in series between the battery voltage and a ground voltage, and the switch may be enabled in response to the measurement control signal. The ADC may convert the divided voltage into a digital signal to generate the digital voltage signal in response to the measurement control signal and an enable pulse signal before the low-power mode is finished, and convert the divided voltage into a digital signal to generate the digital voltage signal in response to the measurement control signal and the enable pulse signal after the low-power mode is finished. Also, the controller may generate the measurement control signal, which is enabled before the low-power mode is finished and disabled after the low-power mode is finished, enable the enable pulse signal during an enabling period of the measurement control signal before the low-power mode is finished, and enable the enable pulse signal after the low-power mode is finished.

In still another aspect, the present invention is directed to an apparatus using a battery. The apparatus includes: a battery for applying a battery voltage; a function unit for receiving the battery voltage to perform an intrinsic operation and cutting off the application of the battery voltage in response to a low-power signal; a voltage divider for dividing the battery voltage to generate a divided voltage; a charge accumulation and switching unit for accumulating charges corresponding to the divided voltage before a low-power mode is finished, generating a voltage corresponding to the accumulated charges as a sensing voltage after the low-power mode is finished, and generating the divided voltage as the sensing voltage; an ADC for receiving the battery voltage to convert the sensing voltage into a digital voltage signal in response to a measurement control signal after the low-power mode is finished; and a controller for receiving the battery voltage to generate the low-power signal for entering the low-power mode, enabling the measurement control signal in response to the low-power signal after the low-power mode is finished, and informing a user of a time to change/recharge the battery using a difference between the digital voltage signals generated after the low-power mode is finished.

The voltage divider may include two resistors and a first switch that are connected in series between the battery voltage and a ground voltage, and the first switch may be enabled in response to a first switching enable signal. Also, the controller may generate the first switching control signal that is enabled before the low-power mode is finished.

The charge accumulation and switching unit may include: a second switch for applying the divided voltage to a first node in response to a second switching control signal; a third switch for applying a voltage at an accumulation node to a second node in response to a third switching control signal; a capacitor connected between the second node and a ground voltage and for accumulating charges corresponding to the voltage applied to the second node; and a fourth switch for applying a voltage at the first node as the sensing voltage in response to a fourth switching control signal. The controller may generate the second and third switching control signals that are enabled before the low-power mode is finished, generate the third and fourth switching control signals that are enabled during an enabling period of the measurement control signal after the low-power mode is finished, and generate the second and fourth switching control signals that are enabled during an enabling period of the measurement control signal. Also, the ADC may convert two sensing voltages, which are applied at different points of time during an enabling period of the measurement control signal after the low-power mode is finished, into digital signals and generate two digital voltage signals.

In the above-described aspects, the controller may detect stoppage of the apparatus to generate the low-power signal. Alternatively, the controller may generate the low-power signal periodically or non-periodically during an operation of the apparatus. The controller may calculate a difference between the digital voltage signals generated in two different points of time, compare the difference or a value obtained using the difference with a set value, and inform the user of the time to change/recharge the battery. Further, the set value may be a digital voltage signal corresponding to a difference between a first reference battery voltage measured before the low-power mode is finished and a second reference battery voltage measured after the low-power mode is finished. In this case, the first reference battery voltage may be obtained by subtracting a product of an internal resistance of the battery and a current consumed in the apparatus during an operation of the apparatus from an electromotive force (EMF) of the battery, and the second reference battery voltage may be obtained by subtracting a product of the internal resistance of the battery and a current consumed in the apparatus during stoppage of the apparatus from the EMF of the battery.

In yet another aspect, the present invention is directed to a method of detecting a time to change/recharge a battery of an apparatus using the battery. The method includes: setting a low-power mode; dividing a battery voltage to generate a divided voltage before the low-power mode is finished and converting the divided voltage into a digital signal to generate a first digital voltage signal; dividing the battery voltage to generate the divided voltage after the low-power mode is finished, and converting the divided voltage into the digital signal to generate a second digital voltage signal; and informing a user of a time to change/recharge the battery using the first and second digital voltage signals.

In the low-power mode, stoppage of the apparatus may be detected to generate the low-power signal or the low-power signal may be generated periodically or non-periodically during an operation of the apparatus. Also, the method may further include: calculating a difference between digital voltage signals generated in two different points of time, comparing the difference or a value obtained using the difference with a set value, and informing a user of a time to change/recharge the battery based on the comparison result. Further, the set value may be a digital voltage signal corresponding to a difference between a first reference battery voltage measured before the low-power mode is finished and a second reference battery voltage measured after the low-power mode is finished. In this case, the first reference battery voltage may be obtained by subtracting a product of an internal resistance of the battery and a current consumed in the apparatus during an operation of the apparatus from EMF of the battery. The second reference battery voltage may be obtained by subtracting a product of the internal resistance of the battery and a current consumed in the apparatus during stoppage of the apparatus from the EMF of the battery.

In yet another aspect, the present invention is directed to a wireless optical pointing apparatus including: a battery for applying a battery voltage; a light source for receiving the battery voltage to generate light; a battery voltage detector for receiving the battery voltage, detecting the battery voltage in a first power mode in response to a low-power signal to generate a first signal, and detecting the battery voltage in a second power mode to generate a second signal; and a controller for generating the low-power signal to distinguish the first power mode from the second power mode, and generating a detection signal for indicating a time to change/recharge the battery using the first and second signals.

The battery voltage detector may include: a voltage divider for dividing the battery voltage to generate a divided voltage in each of the first and second power modes; and an ADC for converting the divided voltage into a digital signal to generate each of the first and second signals.

The wireless optical pointing apparatus may further include a wireless transceiver for transceiving data wirelessly, and the detection signal may be externally transmitted through the wireless transceiver. Also, the apparatus may further include a display unit, and information corresponding to the detection signal may be displayed on the display unit.

In yet another aspect, the present invention is directed to a method of detecting a time to change/recharge a battery of a wireless optical pointing apparatus. The apparatus includes: the battery for applying a battery voltage; and a light source for receiving the battery voltage to generate light. The method includes: detecting the battery voltage to generate a first signal in a first power mode in which the wireless optical pointing apparatus consumes high power; detecting the battery voltage to generate a second signal in a second power mode in which the wireless optical pointing apparatus consumes low power; and detecting a time to change/recharge the battery using the first and second signals.

The light source may be turned off in the first power mode and turned on in the second power mode.

When the light source is turned on, the battery voltage may be detected to generate the first signal. When the light is turned off, the battery voltage may be detected to generate the second signal. Thus, the time to change/recharge the battery may be detected using the first and second signals. The first signal may be generated by dividing the battery voltage to generate a divided voltage and converting the divided voltage into a digital signal. The second signal may be generated by dividing the battery voltage to generate a divided voltage and converting the divided voltage into a digital signal. Also, the detection of the time to change/recharge the battery may include calculating a difference between the first and second signals and comparing a value obtained using the difference with a set value.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale and are to emphasis instead being placed upon illustrating the principles of the invention.

DETAILED DESCRIPTION OF THE INVENTION

An apparatus using a battery and a method of detecting the time to change or recharge the battery of the apparatus according to the present invention will be described more fully hereinafter with reference to the accompanying drawings, in which exemplary embodiments of the invention are shown.

Figure 2:
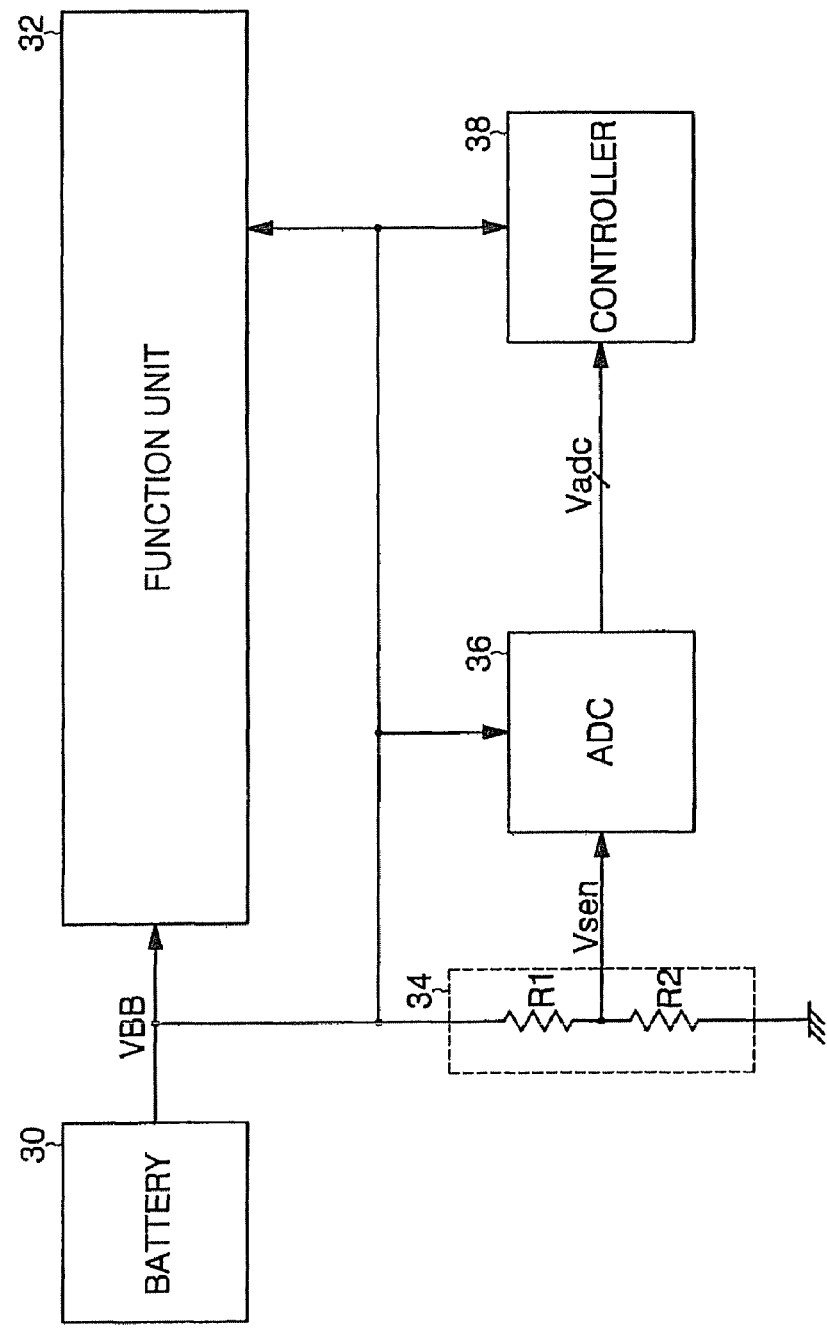
FIG. 2 is a block diagram of an apparatus using a battery according to an exemplary embodiment of the present invention.

FIG. 2 is a block diagram of an apparatus using a battery according to an exemplary embodiment of the present invention.

Referring to FIG. 2, the apparatus includes a battery 30, a function unit 32, a voltage divider 34, an analog digital converter (ADC) 36, and a controller 38. The voltage divider 34 includes resistors R1 and R2. In FIG. 2, the voltage divider 34 and the ADC 36 constitute a battery change/recharge time detector.

Functions of the respective blocks shown in FIG. 2 will now be described.

Figure 1:
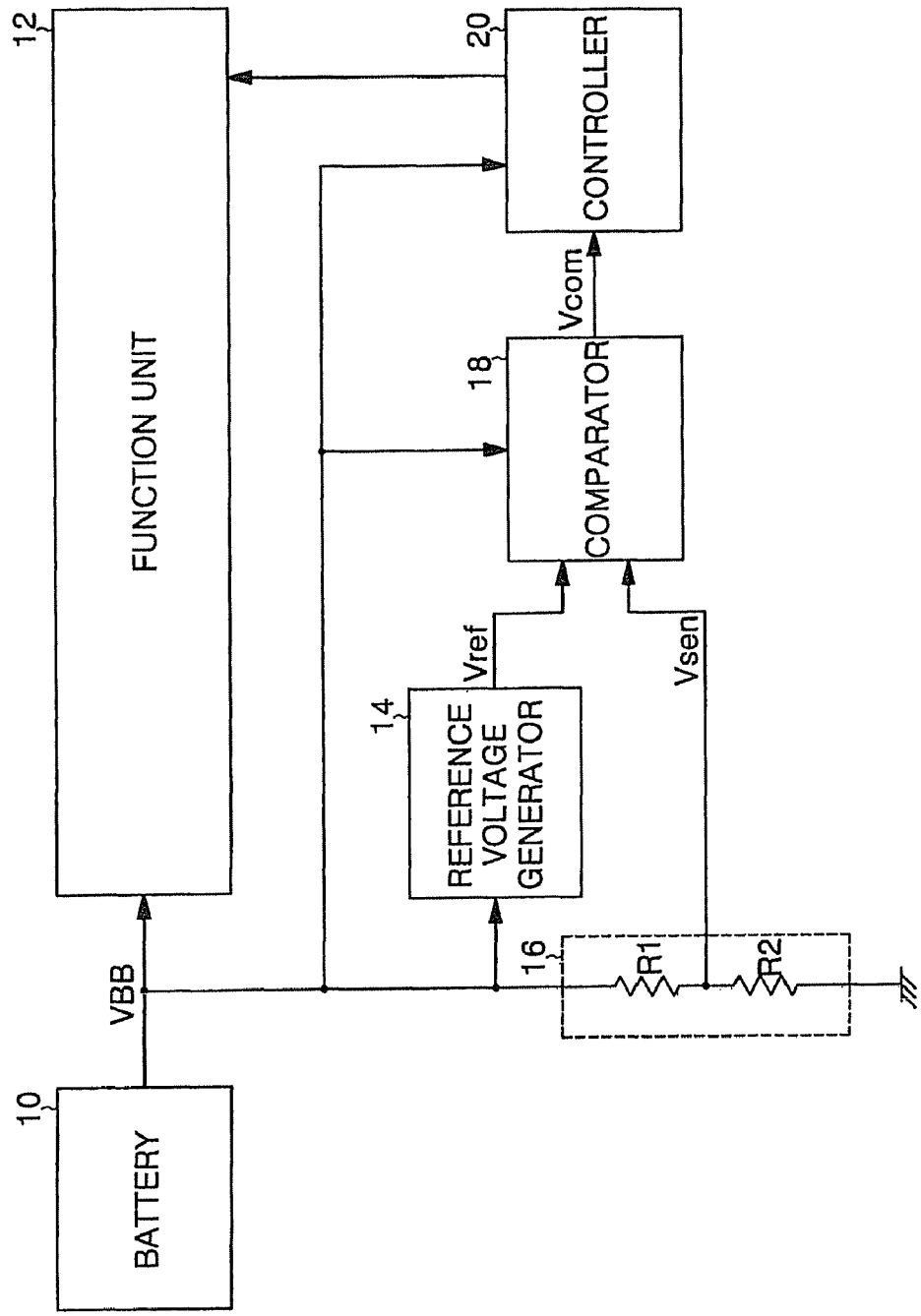
FIG. 1 is a block diagram of a conventional apparatus using a battery.

The battery 30, the function unit 32, and the voltage divider 34 perform the same functions as the battery 10, the function unit 12, and the voltage divider 16 of FIG. 1, respectively. The ADC 36 converts a divided voltage Vsen into a digital signal and generates a digital voltage signal Vadc. The controller 38 stores a first digital voltage signal Vadc, continuously and/or at predetermined time intervals monitors a second digital voltage signal Vadc, compares a difference between the first digital voltage signal and the second digital voltage signal with a set value, and informs a user of the time to change the battery 30 based on the comparison result. That is, when the difference is greater than the set value, the controller 38 warns the user to change the battery 30. Here, the first digital voltage signal Vadc corresponds to a battery voltage measured before the apparatus starts its operation after the battery 30 is changed and/or before a power source switch (not shown) is turned on, while the second digital voltage signal Vadc2 corresponds to a battery voltage measured during the operation of the apparatus after the battery 30 is changed or after the power source switch is turned on.

Figure 3:
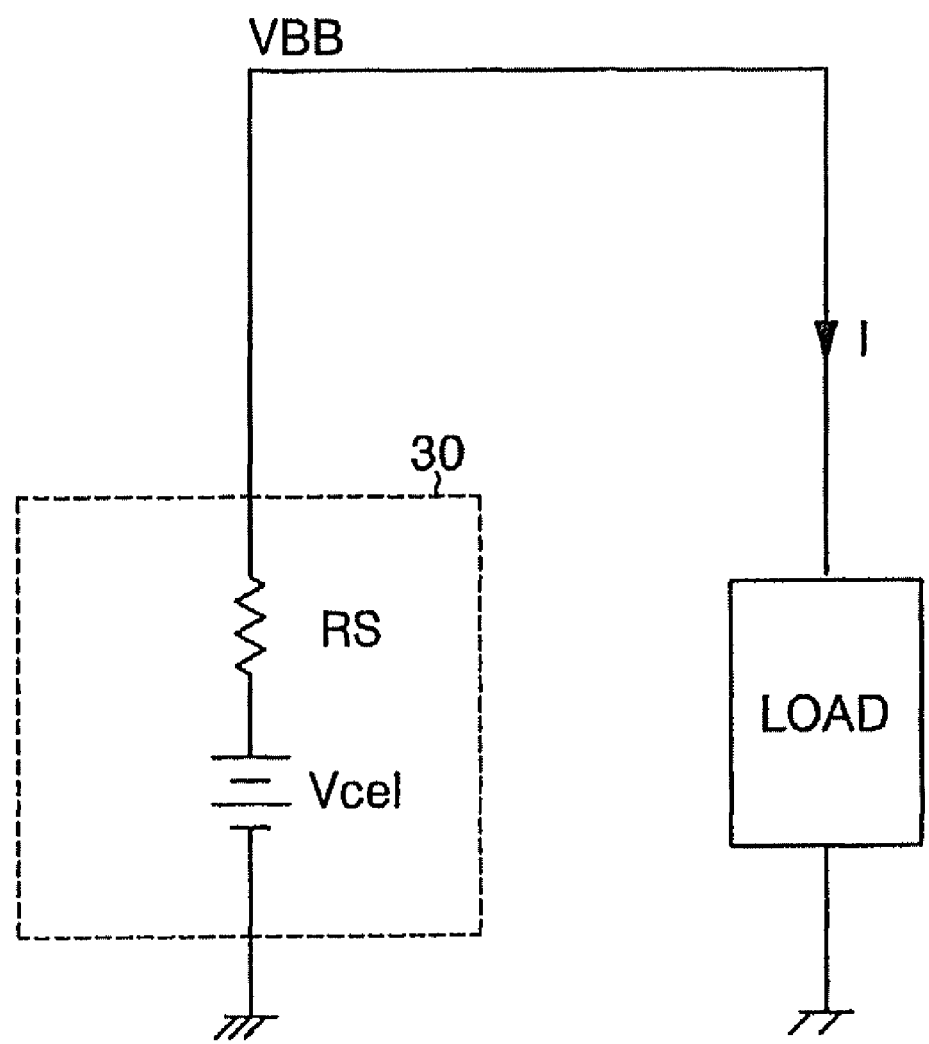
FIG. 3 is an equivalent circuit diagram of the apparatus shown in FIG. 2.

FIG. 3 is an equivalent circuit diagram of the apparatus shown in FIG. 2.

Referring to FIG. 3, the battery 30 includes an internal resistor Rs and a battery intrinsic voltage Vcel which are serially connected to each other, and a load refers to all components that receive a battery voltage VBB and operate. That is, the function unit 32, the voltage divider 34, the ADC 36, and the controller 38 of FIG. 2 may correspond to the load.

A method of detecting the time to change a battery using the digital voltage signal Vadc of the controller 38 will now be described with reference to FIG. 3.

When the apparatus does not operate after the battery 30 is changed and before the power source switch is turned on, the battery voltage VBB is Vcel−(Rs×Istb). Here, "Istb" denotes a current flowing through the load when the apparatus does not operate. Also, while the apparatus is operating, the battery voltage VBB becomes Vcel−(Rs2×Iact). Here, "Iact" denotes a current flowing through the load while the apparatus is operating.

A voltage Vsen, that may be obtained by dividing the battery voltage Vcel−(Rs×Istb) measured when the apparatus does not operate after the battery 30 is changed and before the power source switch is turned on, can be known as a voltage Vsen1.

A voltage Vsen, that may be obtained by dividing the battery voltage Vcel−(Rs×Iact) that varies with the consumption of the battery 30 during the operation of the apparatus, can be known as a voltage Vsen2.

The controller 38 stores a first digital voltage signal Vadc1 corresponding to the voltage Vsen1, compares a difference between the first digital voltage signal Vadc1 and a second digital voltage signal Vadc2 corresponding to the voltage Vsen2 with a set value, and warns a user to change the battery 30 when the difference is greater than the set value.

The set value stored in the controller 38 may be a voltage (DV=Rs×(Iact−Istb)) that is obtained by subtracting the battery voltage Vcel−(Rs×Istb) from the battery voltage Vcel−(Rs×Iact). The internal resistor Rs becomes a value DV/(Iact−Istb) obtained from the set value (DV=Rs×(Iact−Istb)). Here, the currents Iact and Istb may be set when the entire system is designed. The resistance of the internal resistor Rs at the time for a change of the battery 30 may be statistically obtained when the entire system is designed. Therefore, the set value stored in the controller 38 may be the digital voltage signal of the voltage DV that is obtained using the currents Iact and Istb and the resistance of the internal resistor Rs.

As a result, the apparatus using the battery according to the present invention stores the voltage DV corresponding to the resistance of the internal resistor Rs at the time for a change of the battery 30 as a set value, compares a difference between the measured two voltage signals Vadc1 and Vadc2 with the set value, and warns the user to change the battery 30. Thus, even if the intrinsic voltage of the battery 30 is changed, the apparatus of the present invention can inform the user of an exact time to change the battery 30.

It is described above with reference to FIG. 2 that the first digital voltage signal Vadc1 corresponds to a battery voltage measured before the apparatus starts its operation after the battery 30 is changed and/or before a power source switch is turned on, while the second digital voltage signal Vadc2 corresponds to a battery voltage measured while the apparatus is operating. However, the present invention is not limited thereto and two or more battery voltages that are measured consecutively or at predetermined time intervals during the operation of the apparatus may be used instead.

In this case, however, the ADC 36 should operate consecutively or at predetermined time intervals and the controller 38 also should operate consecutively or at predetermined time intervals to detect the time for a change of the battery 30, thus increasing both the power consumption of the battery 30 and the burden of the controller 38.

Figure 4:
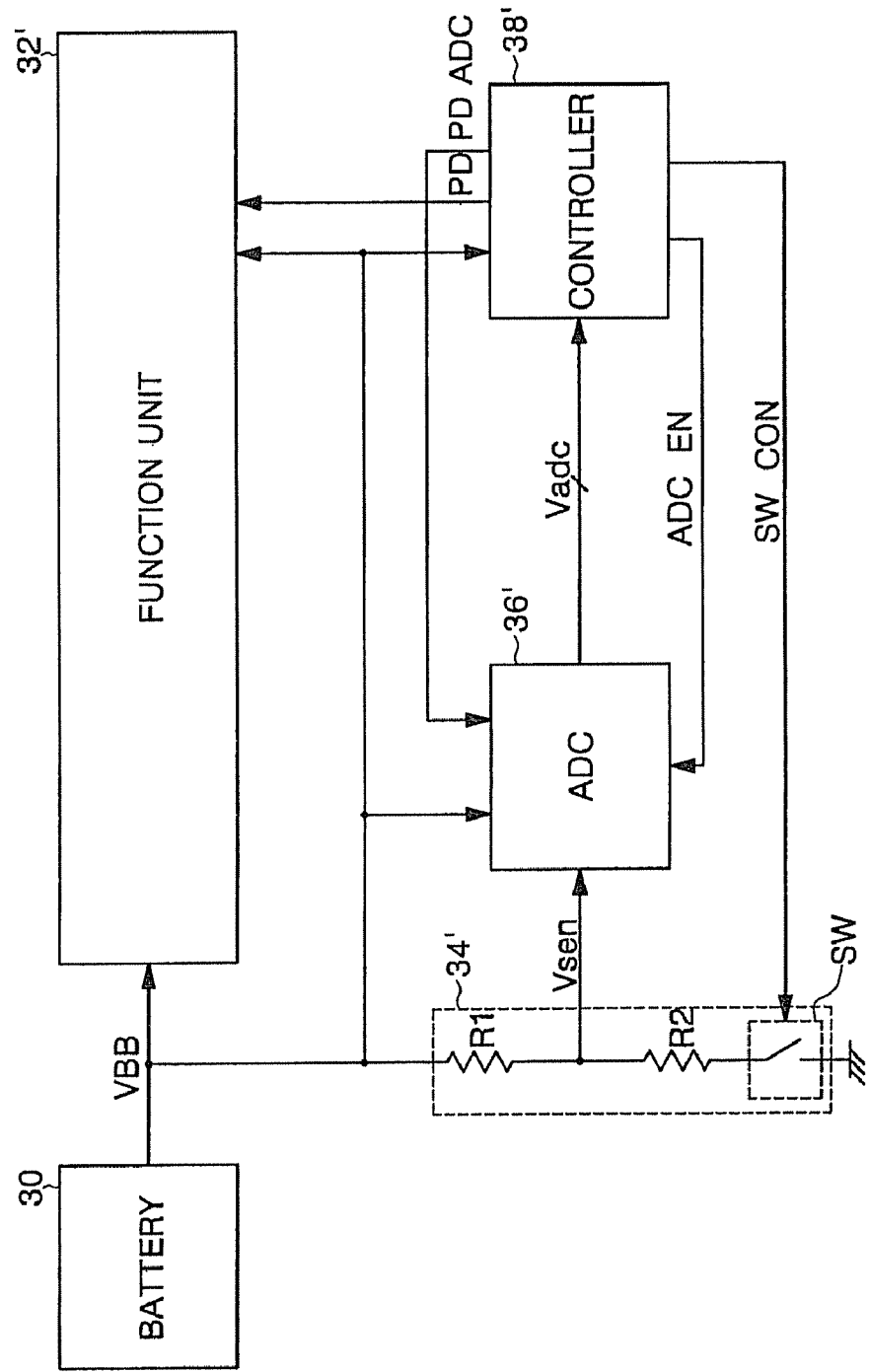
FIG. 4 is a block diagram of an apparatus using a battery according to another exemplary embodiment of the present invention.

FIG. 4 is a block diagram of an apparatus using a battery according to another exemplary embodiment of the present invention.

Referring to FIG. 4, the function unit 32, the voltage divider 34, the ADC 36, and the controller 38 of FIG. 2A are replaced by a function unit 32', a voltage divider 34', an ADC 36', and a controller 38', respectively. The voltage divider 34' includes resistors R1 and R2 and a switch SW.

Functions of the respective blocks shown in FIG. 4 will now be described.

A battery 30 applies a battery voltage VBB. The function unit 32' receives the battery voltage VBB and performs its own operation under the control of the controller 38'. The controller 38' generates a low-power signal PD to cut off the application of the battery voltage VBB to the function unit 32' or permit the application of the battery voltage VBB to only some function blocks (not shown) of the function unit 32' that are indispensable for the operation of the apparatus. Thus, when the low-power signal PD is generated, the power consumption of the function unit 32' is minimized. When the switch SW is turned on in response to a switching control signal SW CON, the voltage divider 34' divides the battery voltage VBB using the resistors R1 and R2 and generates a divided voltage (Vsen=(R2×VBB)/(R1+R2)). The ADC 36' receives the battery voltage VBB in response to a measurement control signal PD ADC, converts the divided voltage Vsen into a digital signal, and generates a digital voltage signal Vadc in response to an enable signal ADC EN. The controller 38' generates the low-power signal PD when the apparatus does not operate. Alternatively, the controller 38' generates the low-power signal PD periodically or non-periodically during the operation of the apparatus. Also, the controller 38' generates the measurement control signal PD ADC and the switching control signal SW CON, which are enabled a predetermined amount of time before the low-power signal PD is generated and disabled a predetermined amount of time after the low-power signal PD is generated. Further, the controller 38' generates the enable signal ADC EN, which is enabled once before and after each time the low-power signal PD is enabled during the enabling of the measurement control signal PD ADC. Also, the controller 38' receives two digital voltage signals Vadc in response to the enable signal ADC EN, calculates a difference between the two digital voltage signals Vadc, and informs a user of the time to change the battery 30.

A method of detecting the time to change the battery 30 using the controller 38' shown in FIG. 4 will now be described with reference to FIG. 3.

The controller 38' measures the battery voltage VBB once before and once after each time a low-power mode is finished. Before the low-power mode is finished, the battery voltage VBB is Vcel−Rs×Ipd; while after the low-power mode is finished, the battery voltage VBB is Vcel−Rs×Iact. Here, "Iact" denotes a current flowing through a load in an operation mode, and "Ipd" denotes a current flowing through the load in the low-power mode. The controller 38' calculates a difference between a digital voltage signal Vadc applied before exiting the low-power mode and a digital voltage signal Vadc applied after exiting the low-power mode, compares the difference with a set value, and warns the user of the time to change the battery 30.

Figure 5:
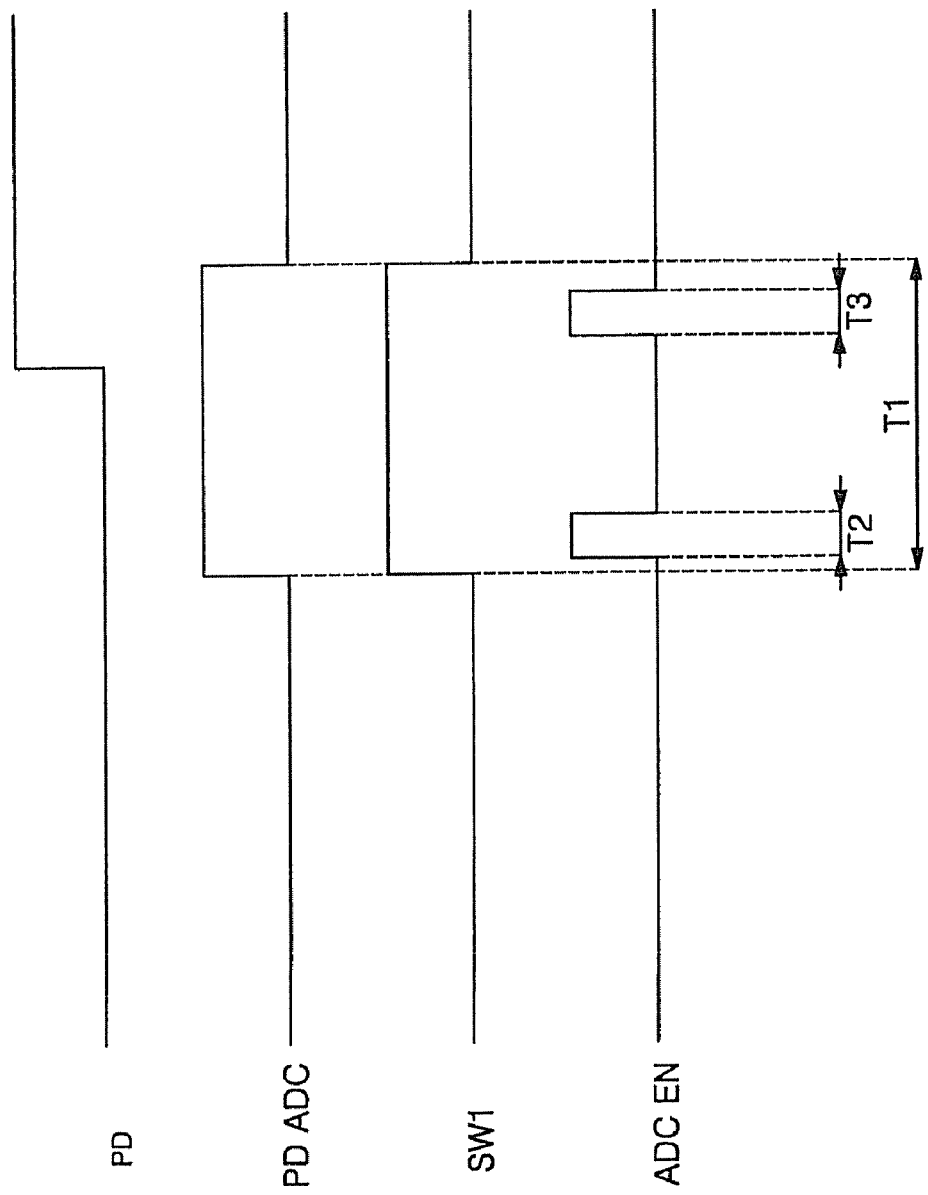
FIG. 5 is a timing diagram illustrating the operation of a controller of the apparatus using the battery shown in FIG. 4.

FIG. 5 is a timing diagram illustrating the operation of the controller of the apparatus using the battery shown in FIG. 4.

When the controller 38' detects the stoppage of the apparatus and enters a low-power mode, the controller 38' generates a low-level low-power signal PD. When the controller 38' detects the operation of the apparatus and enters an operating mode, the controller 38' sends the low-power signal PD to a high level, or enters a low-power mode periodically or non-periodically during the operation of the apparatus to generate the low-power signal PD that remains at a low level, and then makes a low-to-high transition in a predetermined amount of time. The controller 38' enables both the measurement control signal PD ADC and the switching control signal SW1 for a predetermined amount of time before the controller 38' sends the low-power signal PD to a high level. Also, the controller 38' disables both the measurement control signal PD ADC and the switching control signal SW1 for a predetermined amount of time after the controller 38' sends the low-power signal PD to a high level. Further, the controller 38' enables the enable signal ADC EN for a period T2 during an enabling period T1 of the measurement control signal PD ADC before the low-power signal PD is transitioned to a high level. Also, the controller 38' enables the enable signal ADC EN for a period T3 during the enabling period T1 of the measurement control signal PD ADC after the low-power signal PD is transitioned to a high level.

The controller 38' of FIG. 4 may not additionally generate the switching control signal SW1. In this case, the measurement control signal PD ADC may be used as a switching control signal for controlling the switch SW.

The controller 38' of FIG. 4 measures the battery voltage VBB once, just before the low-power mode is finished, and measures the battery voltage VBB once more just after the low-power mode is finished. Thereafter, the controller 38' compares a difference between the two battery voltages VBB with a set value and informs a user of the time to change the battery 30 based on the comparison result. Therefore, even if the intrinsic voltage of the battery 30 is changed, the controller 38' of FIG. 4 may accurately calculate the time to change the battery 30 and inform a user of the time.

Figure 6:
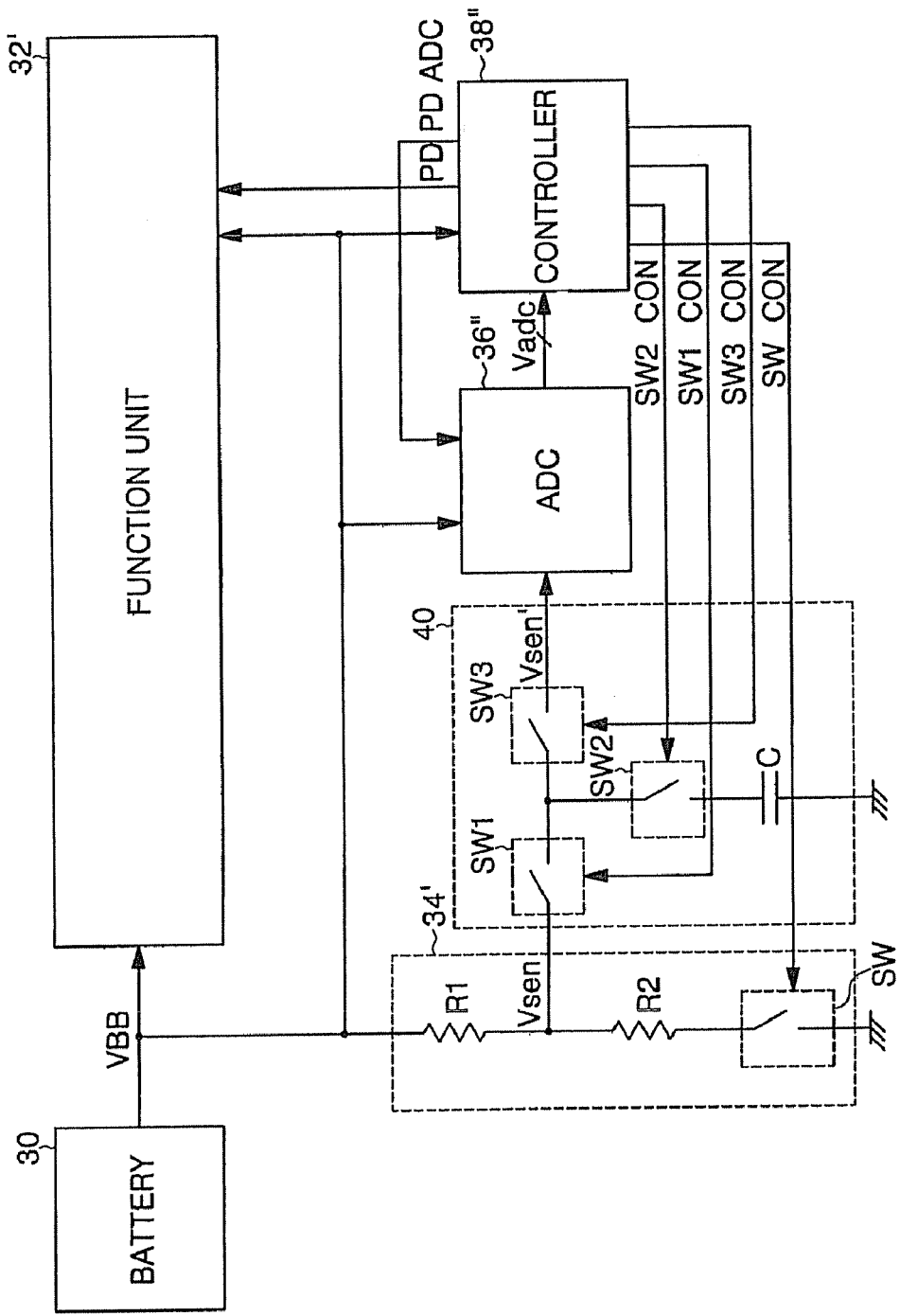
FIG. 6 is a block diagram of an apparatus using a battery according to still another exemplary embodiment of the present invention.

FIG. 6 is a block diagram of an apparatus using a battery according to still another exemplary embodiment of the present invention.

Referring to FIG. 6, the ADC 36' and the controller 38' of FIG. 4 are replaced by an ADC 36" and a controller 38", respectively, and the apparatus further includes a charge accumulation and switching unit 40. The charge accumulation and switching unit 40 includes switches SW1 to SW3 and a capacitor C.

Functions of the respective blocks shown in FIG. 6 will now be described.

A battery 30, a function unit 32', and a voltage divider 34' perform the same functions as the battery 30, the function unit 32', and the voltage divider 34' of FIG. 4, respectively. The switches SW1, SW2, and SW3 are turned on in response to switching control signals SW1 CON, SW2 CON, and SW3 CON, respectively. The capacitor C accumulates charges corresponding to a divided voltage Vsen generated by dividing a battery voltage VBB when a switch SW and the switches SW1 and SW2 are all turned on in response to a switching control signal SW CON and the switching control signals SW1 CON and SW2 CON. Also, the capacitor C transmits a voltage corresponding to the accumulated charges as a sensing voltage Vsen' when the switches SW2 and SW3 are all turned on in response to the switching control signals SW2 CON and SW3 CON. Further, when the switches SW1 and SW3 are all turned on, the capacitor C transmits the divided voltage Vsen generated by dividing the battery voltage VBB as the sensing voltage Vsen'. The ADC 36" receives the battery voltage VBB, converts the sensing voltage Vsen' transmitted through the switch SW3 into a digital voltage signal Vadc in response to a measurement control signal PD ADC, and outputs the digital voltage signal Vadc. The controller 38" receives the battery voltage VBB and performs its operation. The controller 38" detects the stoppage of the apparatus and generates a low-power signal PD. Alternatively, the controller 38" generates the low-power signal PD periodically or non-periodically during the operation of the apparatus. The controller 38" enables the switching control signals SW, SW1, and SW2 for a predetermined amount of time before a low-power mode is finished, and enables the measurement control signal PD ADC when the low-power mode is finished. The controller 38" enables the switching control signals SW, SW1, and SW3 for a predetermined amount of time during an enabling period of the measurement control signal PD ADC after the switching control signals SW2 and W3 are enabled for a predetermined amount of time. Also, the controller 38" calculates a difference between two digital voltage signals Vadc that are generated during the enabling period of the measurement control signal PD ADC, compares the difference with a set value, and informs a user of the time to change the battery 30.

Figure 7:
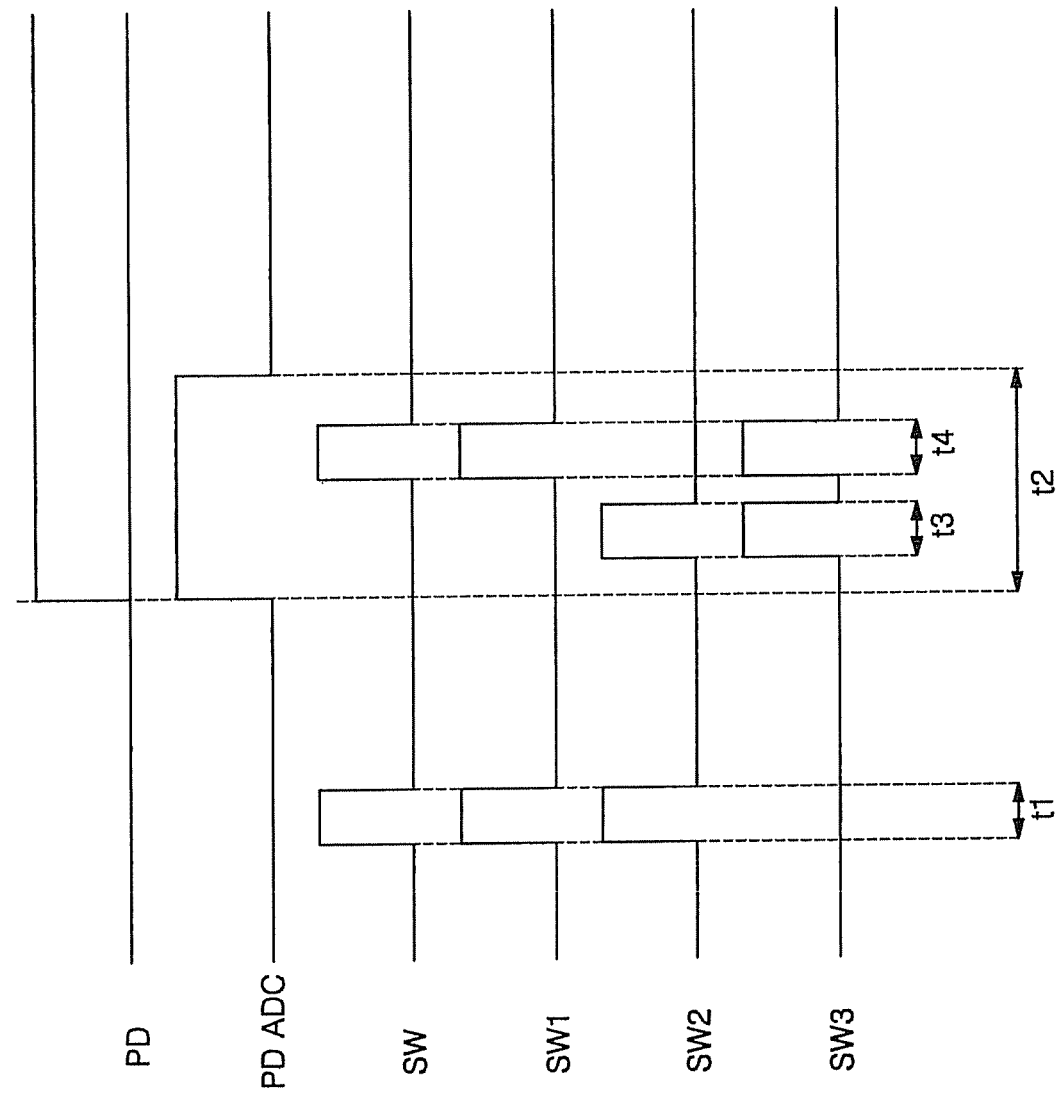
FIG. 7 is a timing diagram illustrating the operation of a controller of the apparatus using the battery shown in FIG. 6.

FIG. 7 is a timing diagram illustrating the operation of the controller of the apparatus using the battery shown in FIG. 6.

The controller 38" enables the switching control signals SW, SW1, and SW2 for a period t1 before a low-power mode is finished, and enables the measurement control signal PD ADC for a period t2 after the low-power mode is finished. Also, the controller 38" enables the switching control signals SW2 and SW3 for a period t3 during the enabling period t2 of the measurement control signal PD ADC, and enables the switching control signals SW, SW1, and SW3 for a period t4 within the enabling period t2 of the measurement control signal PD ADC.

As a result, the divided voltage Vsen, which is generated by dividing the battery voltage VBB in the low-power mode, is stored in the capacitor C during the period t1, the sensing voltage Vsen', which corresponds to the charges filled in the capacitor C, is converted into the digital voltage signal Vadc during the period t3, and the sensing voltage Vsen', which is the same as the divided voltage Vsen generated by dividing the battery voltage VBB in the operating mode, is converted into the digital voltage signal Vadc during the period t4. Assuming that a digital voltage signal Vadc1 is generated during the period t3 and a digital voltage signal Vadc2 is generated during the period t4, the controller 38" compares a difference between the digital voltage signal Vadc1 and the digital voltage signal Vadc2 with a set value and informs a user of the time to change the battery 30.

The apparatus using the battery according to exemplary embodiments of the present invention as illustrated in FIGS. 4 and 6 utilizes a low-power mode so that a voltage divider, an ADC, and a controller may operate only in two predetermined points of time, thus reducing the power consumption of the battery.

It is described above with reference to FIGS. 4 and 6 that the voltage divider includes a switch such that a divided voltage is generated only when the switch is turned on. However, the present invention is not limited thereto and the voltage divider may not include the switch.

Figure 8:
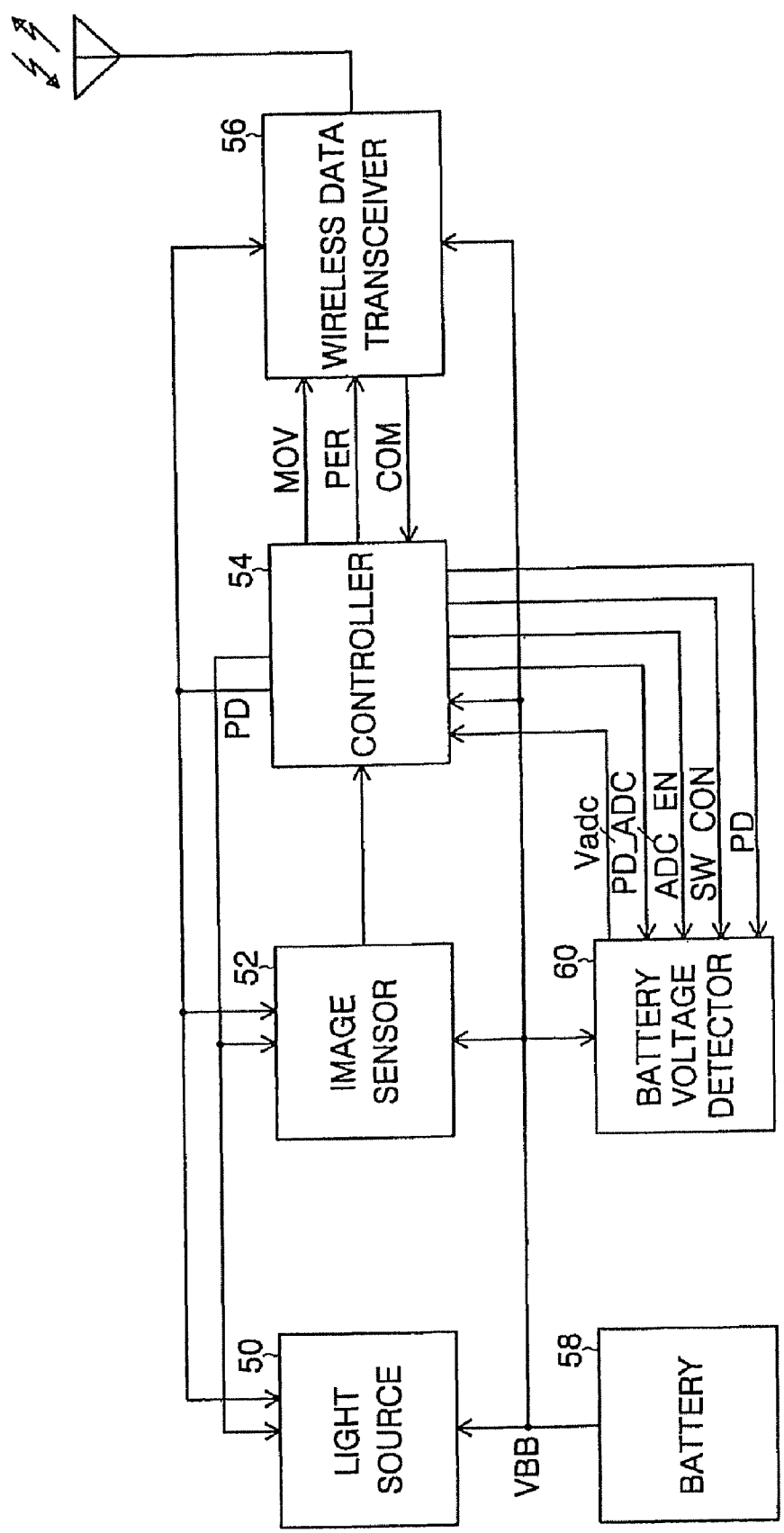
FIG. 8 is a block diagram of a wireless optical pointing apparatus according to the present invention.

FIG. 8 is a block diagram of a wireless optical pointing apparatus according to the present invention.

Referring to FIG. 8, the wireless optical pointing apparatus includes a light source 50, an image sensor 52, a controller 54, a wireless data transceiver 56, a battery 58, and a battery voltage detector 60. The battery voltage detector 60 of FIG. 8 includes the voltage divider 34' and the ADC 36 shown in FIG. 4.

Functions of the respective blocks shown in FIG. 8 will now be described.

When the wireless optical pointing apparatus does not operate or a button (not shown) or scroll apparatus (not shown) of the optical pointing apparatus applies no input signal to the controller 54, the controller 54 generates a low-level low-power signal PD in order to enter a low-power mode. When the wireless optical pointing apparatus operates and the button or scroll apparatus of the optical pointing apparatus applies an input signal to the controller 54, the controller 54 generates a high-level low-power signal PD in response to the input signal or a command signal COM. Also, the controller 54 may be switched to the low-power mode periodically or non-periodically during the operation of the wireless optical pointing apparatus to generate a low-level low-power signal PD, and generate a low-power signal PD that is transitioned to a high level after a predetermined amount of time. Further, the controller 54 performs the same functions as the controller 38' of FIG. 4 in response to the low-power signal PD. That is, the controller 54 generates signals PD ADC, ADC EN, and SW CON, receives digital voltage signals Vadc generated in two or more different points of time, calculates the time to change or recharge the battery 58, and generates a detection signal PER when it is the time to change or recharge the battery 58. The light source 50 generates light under the control of the controller 54 and cuts off the application of a battery voltage VBB in response to the low-power signal PD. The image sensor 52 receives and generates an image signal obtained due to reflection of the light irradiated from the light source 50 by a worktable (not shown) and cuts off the application of the battery voltage VBB in response to the low-power signal PD. The wireless data transceiver 56 receives a signal from an external computer (not shown), generates the command signal COM, and transmits a motion value MOV and the detection signal PER. The command signal COM may command the wireless optical pointing apparatus to start its operation. Also, the wireless data transceiver 56 permits the battery voltage VBB to be applied only to the minimum function blocks of the wireless data transceiver 56 required for receiving data, in response to the low-power signal PD. The battery 58 generates the battery voltage VBB. The battery voltage detector 60 performs the same operations as the components of FIG. 4 under the control of the controller 54 and thus, a detailed description of the operations of the battery voltage detector 60 will be omitted here for purposes of brevity.

The controller 54 of FIG. 8 may employ a digital voltage signal Vadc generated when the light source 50 is turned on and a digital voltage signal Vadc generated when the light source 50 is turned off, in order to detect the time to change or recharge the battery 58. In other words, the time to change or recharge the battery 58 may be calculated using the digital voltage signal Vadc generated when the controller 54 enters a low-power mode and turns the light source 50 off, and the digital voltage signal Vadc generated when the controller 54 exits the low-power mode and turns the light source 50 off.

It is exemplarily described that the battery voltage detector 60 of the wireless optical pointing apparatus shown in FIG. 8 includes the components of FIG. 4. However, the present invention is not limited thereto and the battery voltage detector 60 may include components of FIG. 2 or FIG. 6.

Also, the controller 54 of the wireless optical pointing apparatus may detect the time to change or recharge the battery 58 by use of a digital voltage signal Vadc generated in a high-power operating mode (e.g., when the light source 50 is turned on) and a digital voltage signal Vadc generated in a low-power operating mode (e.g., when the light source 50 is turned off). In some cases, the controller 54 of the wireless optical pointing apparatus may turn on and off the light source 50 periodically or non-periodically, measure a digital voltage signal Vadc generated when the light source 50 is turned on and a digital voltage signal Vadc generated when the light source 50 is turned off, and detect a time to change or recharge the battery 58 using the two digital voltage signals Vadc.

Furthermore, the wireless optical pointing apparatus may include a display unit to display information corresponding to a detection signal PER that indicates the time to change or recharge the battery 58. In another method, since the wireless optical pointing apparatus may communicate with an external computer (not shown), the wireless optical pointing apparatus may transmit the detection signal PER to the external computer so that the external computer can display information corresponding to the detection signal on a monitor or generate a warning sound through a speaker.

In the above description, the digital voltage signal Vadc is a digital signal having a predetermined number of bits.

As described above, even if an apparatus is equipped with a battery having a different intrinsic voltage, the apparatus can accurately measure the life of the battery and inform a user of the time to change or recharge the battery. In the above-described embodiments, it is exemplarily described that there are two operating modes where different powers are consumed. However, the present invention is not limited thereto and there may be three or more operating modes.

An apparatus using a battery and a method of detecting the time to change or recharge the battery can inform a user of an exact time to change or recharge a battery even if an intrinsic voltage of the battery is changed.

Exemplary embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A wireless optical pointing apparatus comprising:
    a battery for applying a battery voltage;
    a light source for receiving the battery voltage to generate light;
    a battery voltage detector for receiving the battery voltage, detecting the battery voltage in response to a low-power signal which indicates a first power mode in which the light source is turned on to generate a first signal, and detecting the battery voltage in response to the low-power signal which indicates a second power mode in which the light source is turned off to generate a second signal; and
    a controller for generating the low-power signal for distinguishing the first power mode from the second power mode, and generating a detection signal for indicating a time to change/recharge the battery by comparing a value obtained using a difference between the first and second signals with a set value,
    wherein
    the set value is a digital voltage signal corresponding to a difference between a first reference battery voltage and a second reference battery voltage,
    the first reference battery voltage is obtained by subtracting a product of an internal resistance of the battery and a current consumed in the optical pointing apparatus during the first power mode from EMF of the battery, and
    the second reference battery voltage is obtained by subtracting a product of the internal resistance of the battery and a current consumed in the optical pointing apparatus during the second power mode from the EMF of the battery.

2. The apparatus according to claim 1, wherein the controller generates the low-power signal depending on whether the light source operates or not.

3. The apparatus according to claim 1, wherein the battery voltage detector comprises:
    a voltage divider for dividing the battery voltage to generate a divided voltage in each of the first and second power modes; and
    an analog-to-digital converter (ADC) for converting the divided voltage into a digital signal to generate each of the first and second signals.

4. The apparatus according to claim 1, further comprising a wireless transceiver for transceiving data wirelessly,
    wherein the detection signal is externally transmitted through the wireless transceiver.

5. The apparatus according to claim 1, further comprising a display unit,
    wherein information corresponding to the detection signal is displayed on the display unit.

6. A method of detecting a time to change/recharge a battery of a wireless optical pointing apparatus comprising the battery for applying a battery voltage and a light source for receiving the battery voltage to generate light, the method comprising:
    detecting the battery voltage to generate a first signal in a first power mode in which the light source is turned on;
    detecting the battery voltage to generate a second signal in a second power mode in which the light source is turned off; and detecting a time to change/recharge the battery by comparing a value obtained using a difference between the first and second signals with a set value,
wherein
the set value is a digital voltage signal corresponding to a difference between a first reference battery voltage and a second reference battery voltage,
the first reference voltage is obtained by subtracting a product of an internal resistance of the battery and a current consumed in the optical pointing device during the first power mode from EMF of the battery, and
the second reference voltage is obtained by subtracting a product of the internal resistance of the battery and a current consumed in the optical pointing apparatus during the second power mode from the EMF of the battery.

7. The method according to claim 6, wherein the first signal is generated by dividing the battery voltage to generate a divided voltage, and converting the divided voltage into a digital signal.

8. The method according to claim 6, wherein the second signal is generated by dividing the battery voltage to generate a divided voltage, and converting the divided voltage into a digital signal.

* * * * *